United States Patent [19]

Kaempf et al.

[11] Patent Number: 5,137,799
[45] Date of Patent: Aug. 11, 1992

[54] ELECTRICALLY CONDUCTIVE RESIST MATERIAL, A PROCESS FOR ITS PREPARATION AND ITS USE

[75] Inventors: Guenther Kaempf, Oestrich-Winkel; Michael Feldhues, Bad Soden-Neunhain; Ude Scheunemann, Liederbach; Juergen Lingnau, Mainz-Laubenheim, all of Fed. Rep. of Germany

[73] Assignee: Hoechst Aktiengesellschaft, Frankfurt am Main, Fed. Rep. of Germany

[21] Appl. No.: 474,367

[22] Filed: Feb. 2, 1990

[30] Foreign Application Priority Data

Feb. 6, 1989 [DE] Fed. Rep. of Germany ....... 3903421

[51] Int. Cl.$^5$ .............................................. G03C 1/73
[52] U.S. Cl. .................................. 430/270; 430/296; 430/311; 522/112; 522/118; 522/119; 522/127; 522/142; 522/146; 526/256
[58] Field of Search .................... 430/271, 296, 270; 522/112, 118, 119, 127, 146, 142; 526/256

[56] References Cited

U.S. PATENT DOCUMENTS

| | | | |
|---|---|---|---|
| 3,557,068 | 1/1971 | Huber | 526/256 |
| 3,931,248 | 1/1976 | Maekawa et al. | 526/256 |
| 4,399,239 | 8/1983 | Herwig et al. | 430/289 |
| 4,909,959 | 3/1990 | Lemaire et al. | 526/256 |
| 4,962,158 | 10/1990 | Kobayashi et al. | 522/118 |
| 4,968,583 | 11/1990 | Ohshio et al. | 430/296 |
| 4,986,886 | 1/1991 | Wei et al. | 526/256 |
| 4,988,608 | 1/1991 | Tanaka et al. | 430/322 |
| 5,002,852 | 3/1991 | Lewis et al. | 430/296 |

FOREIGN PATENT DOCUMENTS

| | | |
|---|---|---|
| 0315375 | 5/1989 | European Pat. Off. |
| 0348961 | 1/1990 | European Pat. Off. |

OTHER PUBLICATIONS

Chem. Abs. (102) 229567n (1985).
Chem. Abs. (108) 29440c (1988).
Patent Abstracts of Japan, vol. 11, No. 331 of JP-A-62 113136 dated May 25, 1987.
Patent Abstracts of Japan, vol. 11, No. 331 or JP-A-62 113134 dated May 25, 1987.
Patent Abstracts of Japan, vol. 11, No. 331, of JP-A-62 113139 dated May 25, 1987.

*Primary Examiner*—Marion E. McCamish
*Assistant Examiner*—Christopher D. RoDee
*Attorney, Agent, or Firm*—Foley & Lardner

[57] ABSTRACT

An electrically conductive resist material is disclosed, comprising at least one polymer which is sensitive to ionizing radiation and a soluble electrically conductive oligomer or polymer. A process for producing the resist material is also described, comprising admixing an electrically conductive oligomer or polymer dissolved in a solvent to at least one polymer which is sensitive to ionizing radiation. The resist material is useful in preparing electron beam resists which prevent electrostatic charging and resultant electrostatic fields.

20 Claims, 2 Drawing Sheets

ELECTRICALLY CONDUCTIVE RESIST MATERIAL, A PROCESS FOR ITS PREPARATION AND ITS USE

BACKGROUND OF THE INVENTION

The invention relates to an electrically conductive resist material which can prevent electrostatic charging and the fields resulting therefrom, to a process for its preparation and its use, in particular for the preparation of electron beam resists.

It is known that in particular upon exposure to electron beams for producing very fine resist structures in the submicron region on non-conducting substrates such as glass, quartz, lithium niobate, undoped silicon, germanium or III-V semiconductors, electric fields are generated by means of secondary electrons, which deflect the primary beam, resulting in unsatisfactory image reproduction (cf. Appl. Phys. Lett. 48(13), 835 (1986)). Similar resolution-limiting effects are also observed in the use of scanning electron microscopy for inspecting and measuring integrated circuits.

Examples of suitable compounds for avoiding charging effects are as follows: indium oxide, tin oxide or ITO layers on glass substrates, to which the resist is then applied (cf. Chem. Abstr. 102, 229.567n).

The use of a carbon film as conductive bottom layer requires an additional heat treatment of up to 400° C. after the deposition of the film. However, this may have the effect that subsequent or already performed process steps may become useless (cf. Appl. Phys. Lett. 48 (13), 835 (1986)).

By applying a solution of ammonium polystyrene sulfonate as top or bottom layer, it is also possible to suppress charging effects (cf. New Materials/Japan, 9 (5), 13 (1988)).

Furthermore, a resist material is known which comprises a conducting polymer tetracyanoquinone dimethane (TCNQ)salt complex in a PMMA matrix in order to avoid a charging effect. The disadvantage of this method is that TCNQ complexes are, as a rule, insoluble or slightly soluble, which may lead to phase separation when the resist material is applied. Moreover, TCNQ complexes are difficult to handle due to their toxicity and their decomposition at elevated temperatures(cf. Chem. Abstr. 108, 29440c).

SUMMARY OF THE INVENTION

Accordingly, it is an object of the present invention to provide an electrically conductive resist material which does not have the above-mentioned disadvantages and which furthermore can be processed by the methods usually used in microelectronics.

Another object of the present invention is to provide a process for producing the above-mentioned electrically conductive resist material.

A further object of the present invention is to provide a method for preparing electron beam resists which prevents electrostatic charging and the production of resultant electrostatic fields.

In accomplishing the foregoing objectives, there has been provided, in accordance with one aspect of the present invention, an electrically conductive resist material comprising at least one polymer which is sensitive to ionizing radiation and a soluble electrically conductive oligomer or polymer.

In accordance with another aspect of the present invention there is provided a process for the preparation of the foregoing resist material, which comprises the step of admixing an electrically conductive oligomer or polymer dissolved in a suitable solvent to at least one polymer which is sensitive to ionizing radiation.

In accordance with a further aspect of the present invention, there is provided a method of preventing electrostatic charging and electrostatic fields resulting therefrom in the preparation of electron beam resists comprising the step of applying to an insulating substrate the above-described resist material.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

Figure 1:
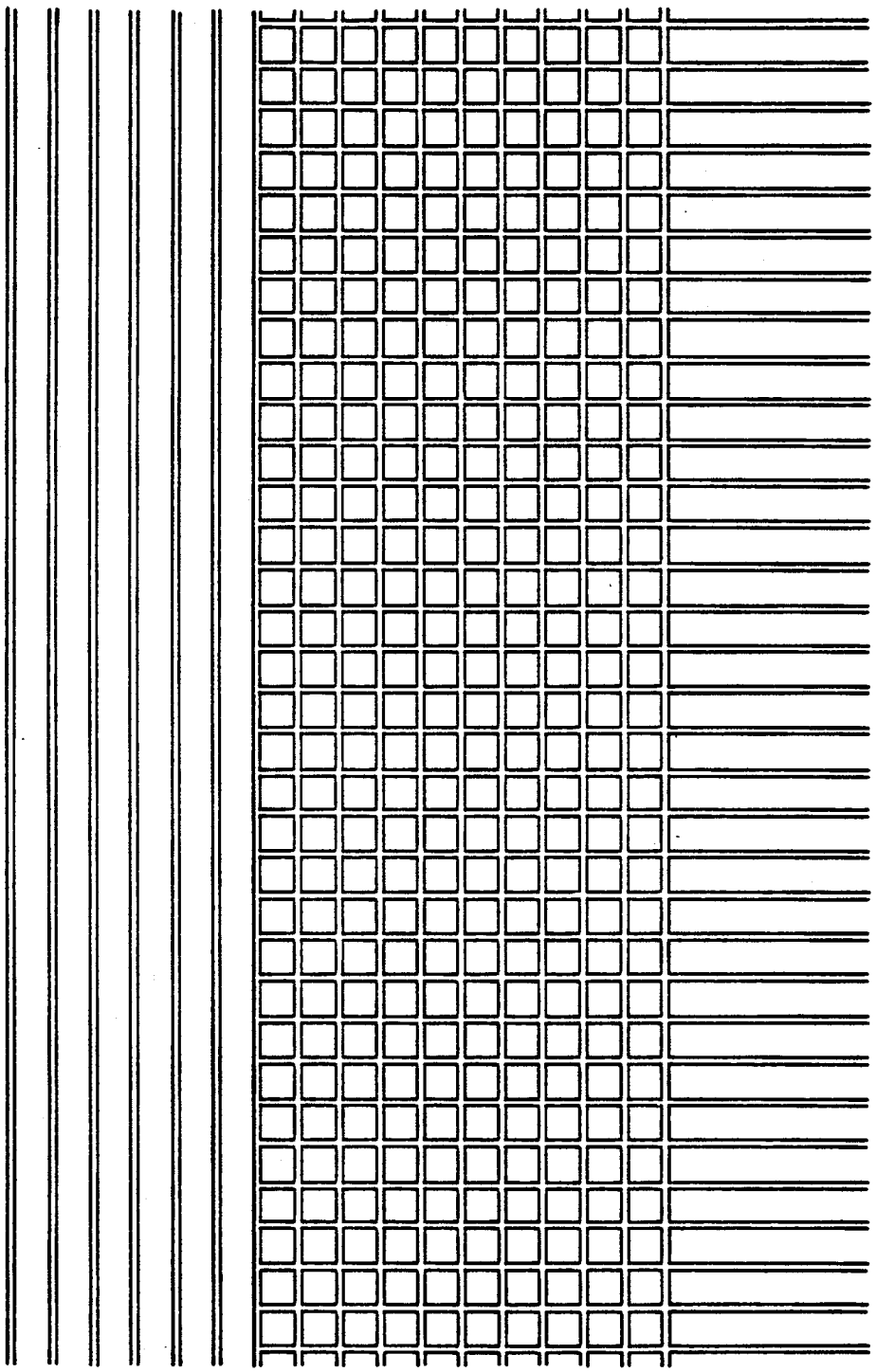
FIG. 1 represents the structure reproduced in Examples 1–4 according to the invention.

It has been found that the addition of soluble electrically conductive oligomers or soluble electrically conductive polymers to customary resist formulations, which are sensitive to ionizing radiation, contributes the conductivity necessary to avoid charging effects without having to change radically the processing steps necessary for the structuring.

In principle, all known formulations can be used for preparing the electron beam resist. Suitable formulations are those based on novolak as binder of both the positive-working and also the negative-working type. However, formulations of polymers which are cross-linkable or degradable by high-energy radiation are also suitable. Due to their low water absorption, in particular resists of this type which have to be developed in a solvent show particularly aggravating charging effects, which can be prevented by the addition of soluble electrically conductive oligomers or polymers. Examples are halogenated or nonhalogenated polyacrylates, polymethacrylates, polyolefin sulfones, if appropriate in combination with another binder, or chlorinated or chloromethylated polystyrenes and copolymers thereof or epoxidized polybutadienes.

The conductive oligomers or conductive polymers used can be basically compounds whose solubility is sufficiently high in the solvents used in the resist formulations. These include oligo- and polythiophene derivatives which additionally carry substituents in the 3-position. 3-Alkoxy-substituted oligo- and polythiophenes are preferably used. Examples are 3-butylthiophene, 3-pentylthiophene, 3-hexylthiophene,3-octylthiophene, 3-dodecylthiophene, 3-(methoxyethoxyethoxymethyl)-thiophene, 3,4-diethylthiophene, 3-butyl-4-methylthiophene, 3-methoxythiophene, 3-ethoxythiophene, 3-propoxythiophene, 3-(methoxyethoxy)thiophene, 3-methoxy-4-methylthiophene, 3-ethyl-4-methoxythiophene, 3-butyl-4-methoxythiophene, 3-ethoxy-4-methylthiophene, 3-ethoxy-4-ethylthiophene, 3-butoxy- 4-methylthiophene, 3,4-dimethoxythiophene, 3-ethoxy-4-methoxythiophene or 3-butoxy-4-methylthiophene.

Particularly good properties (e.g. particularly high solubilities) are achieved if the alkoxy group contains at least 6 carbon atoms, preferably 6 to 25 carbon atoms, as in the case of 3-hexyloxythiophene, 3-heptyloxythiophene, 3-octyloxythiophene, 3-nonyloxythiophene, 3-decyloxythiophene, 3-undecyloxythiophene, 3-dodecyloxythiophene, 3-tetradecyloxythiophene, 3-pentadecyloxythiophene, 3-hexadecyloxythiophene, 3-octadecyloxythiophene, 3-eicosyloxythiophene, 3-docosyloxythiophene, 3-(2'-ethylhexyloxy)thiophene, 3-(2',4',4'-trimethylpentyloxy)thiophene, 3,4-dihexyloxythiophene, 3,4-dioctyloxythiophene, 3,4-dinonyloxythiophene, 3,4-didodecyloxy-thiophene, 3-methoxy-4-pentyloxythiophene, 3-hexyloxy-4-methoxythiophene, 3-methoxy-4-nonyloxythiophene, 3-dodecyloxy-4-methoxythiophene, 3-docosyl-4-methoxythiophene, 3-ethoxy-4-pentyloxythiophene, 3-ethoxy-4-hexloxythiophene, 3-butoxy-4-dodecyloxythiophene or 3-(2'-ethylhexyloxy)-4-methoxythiophene.

Depending on the conductivity of the oligomer or polymer present in the material and on the basic conductivity of the formulation, the addition of about 0.01 to 10% by weight of the conductive oligomer or polymer, based on the dry matter of the formulation has proven to be favorable, the preferred concentrations being between 0.1 and 5% by weight, in particular between 0.1 and 3% by weight.

The solvents used are those which dissolve not only the components of the formulation but also the conductive oligomer or conductive polymer. The solvents which can be used are glycol ethers, for example glycol monomethyl ether, glycol dimethyl ether, glycol monoethyl ether or propylene glycol monoalkyl ether, preferably propylene glycol methyl ether, aliphatic esters, for example ethyl acetate, hydroxyethyl acetate, alkoxyethyl acetate, n-butyl acetate, propylene glycol monoalkyl ether acetate, preferably propylene glycol methyl ether acetate or amyl acetate, ethers, for example dioxane or tetrahydrofuran, ketones, for example methyl ethyl ketone, methyl isobutyl ketone, cyclopentanone and cyclohexanone, dimethylformamide, dimethylacetamide, hexamethylphosphoric triamide, N-methylpyrrolidone, butyrolactone, aromatics, such as toluene, chlorobenzene, xylenes, and mixtures of the solvents mentioned, if appropriate also in combination with nonsolvents. If appropriate safety procedures and measures for appropriate disposal are taken, the coating can also be carried out from other solvents, for example acetonitrile, methoxypropionitrile, methyl cyanoacetate or mixtures thereof.

The application of the conductive resist material according to the invention is not limited to insulating substrates. However, the particular advantage is only displayed when applied to highly insulating substrates. These are undoped semiconductor substrates, such as Si, Ge or GaAs having a small surface area or volume conductivity, substrates having highly insulating coatings of the organic or inorganic type, such as oxide layers, quartz, lithium niobate, strontium titanate, sapphire, diamond, but also insulating sheets of organic polymers, such as polyethylene terephthalate or sheets of inorganic materials, such as silicon, silicon carbide or beryllium membranes.

To improve the adhesion on the substrate, an adhesion promoter can be added to the resist material. However, it is also possible to apply an adhesion promoter to the substrate before the coating.

Furthermore, it is possible to add, if desired, colorants, pigments, plasticizers, wetting agents and flow-improving agents, for example polyglycols, cellulose ethers, preferably ethylcellulose, to the radiation-sensitive mixtures according to the invention to improve specific requirements such as flexibility, adhesion and gloss.

The preparation of the resist material according to the invention can be carried out in such a manner that the electrically conductive oligomer or electrically conductive polymer is first dissolved in a suitable solvent and then added to a finished resist formulation, or the polymer or oligomer forms a layer separate from the resist layer. However, it is also possible to dissolve the conductive compound together with the individual components of the resist formulation in a suitable solvent or solvent mixture. This is done at a temperature between the melting and boiling point of the solvent or solvent mixture used, preferably in the range from about 0° C. to 80° C., in particular from 20° C. to 60° C., if necessary with stirring or other mixing techniques. The concentration of the main components in the solution is about 0.1 to 30, preferably 0.5 to 10% by weight.

The resist material can be processed by conventional methods, such as spin-coating or spraycoating. The layer thickness can be adjusted within wide limits as desired by choosing the coating parameters and solids content of the solution.

Drying is carried out, depending on substrate and application, for example, in an oven, on a hot plate, or, when processed in webs, in a drying channel at elevated temperature, preferably between about 80° and 130° C. The drying at elevated temperature can be preceded by a predrying step at room temperature.

The irradiation is carried out by means of ionizing radiation, for example by means of electron radiation or X-ray radiation, preferably by means of electron radiation.

In principle, the structuring of this type of resist can also be carried out by means of UV light.

The development after the exposure is carried out by means of the developers customary for the particular resist formulations. These are predominantly developers which essentially are organic solvents. In the case of resist formulations containing alkali-soluble or water-soluble binders, aqueous or aqueous-alkaline developers can also be used.

The etching resistance can be increased in the following process steps by maintaining the developed resist layers for some time, for example 5 to 40 minutes at elevated temperature,if appropriate with simultaneous exposure to UV light.

Figure 2:
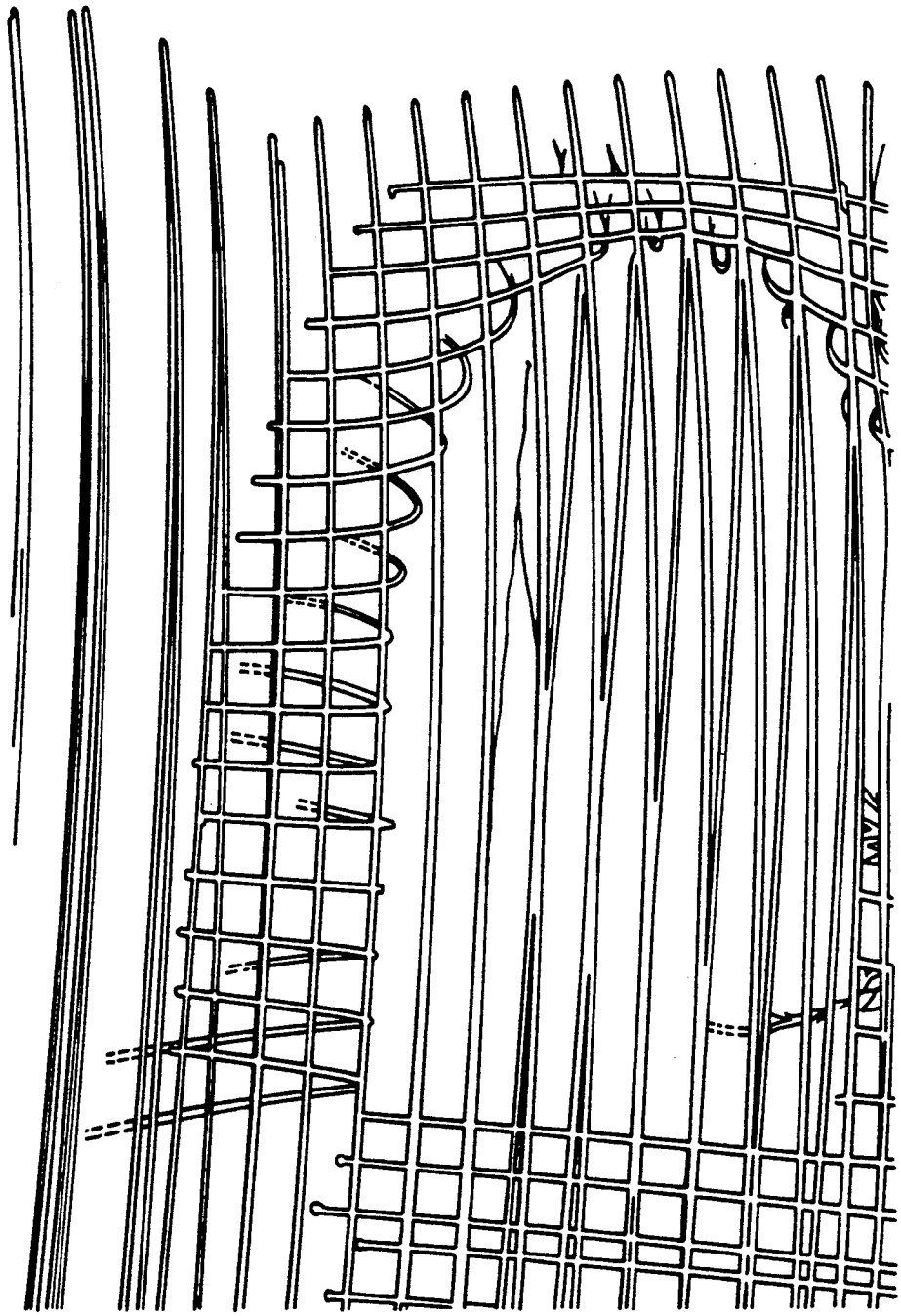
FIG. 2 represents the structure reproduced in Comparative Example B.

Electron beam exposure of a resist on a sufficiently conductive substrate yields a pattern after the development, which is shown in FIG. 1. If, however, charging effects occur, the structures reproduced in FIG. 2 are obtained.

The use of the resist material according to the present invention prevents electrostatic charging and the fields resulting therefrom and thus yields structures according to FIG. 1 also on highly insulating substrates.

The examples which follow are intended to illustrate the invention in more detail.

COMPARATIVE EXAMPLE A 1 g of polymethyl methacrylate (PMMA) was dissolved in 100 ml of tetrahydrofuran, and the mixture was applied to a p-doped Si wafer on a spincoater at 1,000 rpm. Drying at 100° C. for 1 minute (hot plate) gave a layer thickness of 400 nm. It was then irradiated with 100 $\mu$C/cm$^2$ at an accelerating voltage of 25 kV. It was then developed for 40 seconds in a developer consisting of methyl ethyl ketone/isopropanol (ratio by volume 1:4) at 21° C. On top of this sufficiently conductive substrate, the pattern reproduced in FIG. 1 was obtained, which corresponded to the desired pattern.

COMPARATIVE EXAMPLE B

Comparative Example A was repeated, except that an insulating substrate (quartz) was used instead of the conductive substrate of Comparative Example 1. However, following the same procedure, it was not possible to transfer the desired pattern (analogously to FIG. 1) to the resist. Due to the charging effects, the structures reproduced in FIG. 2 were observed.

EXAMPLE 1

Preparation of polydodecyloxythiophene 4.34 g of tetraethylammonium tetrafluoroborate, 5.36 g of 3-dodecyloxythiophene and 200 g of acetonitrile were placed in an undivided electrolytic cell equipped with cooling jacket. The cathode consisted of a stainless steel sheet 60 mm in length and 55 mm in width. The anode used was a platinum sheet 60 mm in length and 55 mm in width. At an electrolysis temperature of 20° C. and an anodic current of 50 mA, a cell voltage of 3 to 6 volt was obtained. After a quarter of the theoretically required amount of current had been consumed, the polymer deposited on the anode was separated off by mechanical means, and the anode was used again. This procedure was repeated until the theoretically required amount of current had been consumed. The collected crude product was comminuted mechanically, washed with water, dried, washed with pentane and acetonitrile, and dried again. The product was taken up in tetrahydrofuran, filtered through a sintered-glass crucible of pore size G3, and the filtrate was evaporated to dryness on a rotary evaporator. This gave 1.88 g of a blue-black shiny solid. Elemental analysis gave the following values: 65.7% C, 9.0% H, 11.1% S, 5.3% F. A compressed powder pellet of the milled product had a specific conductivity of $1.5 \cdot 10^{-2}$ S/cm. A weight loss of less than 10% was observed up to 255° C. by DTG. DSC showed a maximum at 350° C. (130 J/g). The average molecular weight of the undoped form determined by GPC was about 5,400.

0.196 g of polymethyl methacrylate and 0.04 g of polydodecyloxythiophene, prepared according to Example 1, were dissolved in 20 ml of tetrahydrofuran and applied to p-doped silicon according to Comparative Example A. The layer thickness was 380 nm and the specific conductivity $1 \cdot 10^{-8}$ S/cm. It was also irradiated with 100 $\mu$C/cm, at 50 kV. Development within 40 seconds in the developer described in Comparative Example A gave transfer of the structure as in FIG. 1.

EXAMPLE 2

The resist material from Example 1 was applied to an insulating quartz substrate according to Comparative Example B. Irradiation and development as in Comparative Example A gave good structure transfer without distortions according to FIG. 1.

EXAMPLE 3

Example 2 was repeated except that the polydodecyloxythiophene content was increased to 5% by weight of the solid substance. The resulting specific conductivity was $4.3 \cdot 10^{-7}$ S/cm. The result was as in FIG. 1.

EXAMPLE 4

Preparation of polymethoxythiophene 4.34 g of tetraethylammonium tetrafluoroborate, 4.56 g of 3-methoxythiophene and 250 g of acetonitrile were placed in an undivided electrolytic cell equipped with cooling jacket. The cathode consisted of stainless steel sheets 80 mm in length and 55 mm in width. The anode used was a carbon felt (weight per unit area about 0.3 kg/m$^2$, specific surface area (BET) about 1.5 m$^2$/g) 80 mm in length, 55 mm in width and 3 mm in thickness (geometrical area on both sides about 90 cm$^2$). The anode was attached parallel to the cathode at a distance of 2 cm and separated via a spacer made of polypropylene net. At an electrolysis temperature of 20° C. and an anodic current of 400 mA, a cell voltage of 5 to 11 volt was obtained. After half of the theoretically required amount of current had been consumed, the anode covered with the oligomers was exchanged for a new one, and, after the theoretical amount of current had been consumed, the electrolysis was stopped. The anodes covered with the crude product were each dried immediately after the exchange and placed in a bath containing methylene chloride and triturated several times for an extended period of time. After repeated drying, the carbon felts covered with the oligomers were triturated in a bath containing acetonitrile until the oligomers had virtually entirely gone into solution. The deep dark blue solution was evaporated to dryness in a rotary evaporator. The crude product was comminuted mechanically, washed with water, dried, triturated with methylene chloride for 12 hours, then filtered off and dried. It was purified further by redissolving the material obtained in acetonitrile and centrifuging it at 10,000 rpm for 0.5 hour, and evaporating the centrifugate to dryness in a rotary evaporator. This gave 1.92 g of a bronze metallic shiny solid. Elemental analysis gave the following values: 44.5% C, 3.2% H, 22.1% S, 9.4% F. A compressed powder pellet of the milled product had a specific conductivity of $1.8 \times 10^{-3}$ S/cm. A weight loss of less than 10% was observed up to 245° C. by DTG. DSC showed a maximum at 325° C. The molecular ions of the pentamers (m/e=562) and hexamers (m/e=674) were detected in the mass spectrum of the undoped form. GPC of the undoped form showed that more than 80% of the product were pentamers and hexamers. In the UV-/VIS/NIR spectrum in tetrahydrofuran, the undoped pentamer had a maximum at $\lambda=460$ nm, and the undoped hexamer a maximum at $\lambda=486$ nm.

A solution of 0.02 g of polymethoxythiophene and 0.98 g of PMMA in a solvent mixture of 7 ml of acetonitrile and 3 ml of tetrahydrofuran was applied to an insulating substrate. After irradiation with 100 $\mu$C/cm$^2$ at 25 kV, development was carried out in methyl ethyl ketone/isopropanol (1:4) for 60 seconds. The structures obtained were as in FIG. 1.

What is claimed is:

1. An electrically conductive resist material comprising in admixture, as a first component, at least one polymer which is sensitive to ionizing radiation selected from the group consisting of novolaks, polyacrylates, polymethacrylates, polyolefin sulfones, epoxidized polybutadienes, and chlorinated polystyrenes, and, as a second component an electrically conductive oligothiophene or polythiophene which is soluble in a solvent capable of dissolving the other components of the resist material.

2. A resist material as claimed in claim 1, comprising about 0.01 to 10% by weight of said conductive oligomer or polymer, relative to the dry matter of the resist formulation.

3. A resist material as claimed in claim 2, comprising 0.1 to 5% by weight of said conductive oligomer or polymer, relative to the dry matter of the resist formulation.

4. A resist material as claimed in claim 1, wherein said soluble electrically conductive oligomer or polymer is a 3-substituted oligo- or polythiophene.

5. A resist material as claimed in claim 4, wherein said substituent is a 3-alkoxy group.

6. A resist material as claimed in claim 5, wherein said 3-alkoxy group comprises about 6 to 25 carbon atoms.

7. A resist material as claimed in claim 1, further comprising an alkali-soluble binder.

8. A resist material as claimed in claim 1, wherein said at least one polymer is crosslinkable or degradable by high-energy radiation, such that said resist material is developable in a solvent.

9. A resist material as claimed in claim 1, consisting essentially of the recited components.

10. A resist material as claims in claim 1, wherein said polymer is polymethyl methacrylate.

11. A resist material as claimed in claim 1, further comprising an adhesion promoter.

12. A resist material as claimed in claim 1 further comprising an additive selected from the group consisting of colorants, pigments, wetting agents, and flow-improving agents.

13. A resist material as claimed in claim 12, wherein said additive is selected from the group consisting of polyglycols and cellulose ethers.

14. A resist material as claimed in claim 1, wherein the electrically conductive polymer comprises polydodecyloxythiophene or polymethoxythiophene.

15. A resist material as claimed in claim 1, wherein said polymer comprises a novolak.

16. A resist material as claimed in claim 1, which consists essentially of said at least one polymer which is sensitive to ionizing radiation and said oligothiophene or polythiophene.

17. A resist material as claimed in claim 1 which is produced by dissolving said oligothiophene or polythiophene in a solvent and then admixing it with said at least one polymer which is sensitive to ionizing radiation.

18. A resist material as claimed in claim 1 which is produced by dissolving said first and said second components in a solvent and admixing.

19. A resist material as claimed in claim 1, further comprising a solvent.

20. A resist material as claimed in claim 1, wherein said at least one polymer sensitive to ionizing radiation is polymer selected from the group consisting of novolaks, polyolefin sulfones, chlorinated polystyrenes, chloromethylated polystyrenes, and epoxidized polybutadienes.

* * * * *